United States Patent [19]
Suggs

[11] Patent Number: 5,528,181
[45] Date of Patent: Jun. 18, 1996

[54] HAZARD-FREE DIVIDER CIRCUIT

[75] Inventor: David Suggs, Austin, Tex.

[73] Assignee: Advanced Micro Devices, Inc., Sunnyvale, Calif.

[21] Appl. No.: 333,410

[22] Filed: Nov. 2, 1994

[51] Int. Cl.[6] .................................................. H03K 21/00
[52] U.S. Cl. ........................... 327/115; 327/217; 327/153; 377/48
[58] Field of Search ...................... 377/48, 47; 327/115, 327/117, 217, 152, 276, 298, 153

[56] References Cited

U.S. PATENT DOCUMENTS

| | | | |
|---|---|---|---|
| 3,189,832 | 6/1965 | Pugh | 377/48 |
| 4,317,221 | 2/1982 | Toya | 455/76 |
| 4,348,640 | 9/1982 | Clendening | 377/48 |
| 4,394,769 | 7/1983 | Lull | 377/48 |
| 4,443,887 | 4/1984 | Shiramizu | 377/48 |
| 4,540,945 | 9/1985 | Kuroki | 377/115 |
| 4,630,294 | 12/1986 | Willis | 377/48 |
| 4,746,899 | 5/1988 | Swanson et al. | 340/347 |
| 4,758,737 | 7/1988 | Hirano | 327/115 |
| 4,800,524 | 1/1989 | Roesgen | 364/900 |
| 4,805,198 | 2/1989 | Stern et al. | 375/118 |
| 4,823,312 | 4/1989 | Michael et al. | 364/900 |
| 4,918,339 | 4/1990 | Shigeo et al. | 307/542 |
| 5,020,082 | 5/1991 | Takeda | 377/47 |
| 5,084,907 | 1/1992 | Maemura | 377/48 |
| 5,124,579 | 6/1992 | Naghshineh | 307/443 |
| 5,140,679 | 8/1992 | Michael | 395/325 |
| 5,150,386 | 9/1992 | Stern et al. | 375/118 |
| 5,199,105 | 3/1993 | Michael | 395/275 |
| 5,218,239 | 6/1993 | Boomer | 307/443 |
| 5,233,309 | 8/1993 | Spitalny et al. | 330/84 |
| 5,280,595 | 1/1994 | Lemay et al. | 395/425 |
| 5,287,296 | 2/1994 | Bays et al. | 364/703 |
| 5,287,457 | 2/1994 | Arimilli et al. | 395/200 |
| 5,287,470 | 2/1994 | Simpson | 395/425 |
| 5,289,584 | 2/1994 | Thome et al. | 395/325 |
| 5,299,315 | 3/1994 | Chin et al. | 395/250 |

OTHER PUBLICATIONS

Samsung Semiconductor OmniWave™ Multimedia Audio KS0161, Rev. A, Nov. 1994.
OPTi/Media CHIPS Multimedia Audio Controller 82C929, Mar. 29, 1993 Spec Sheet.
Analog Devices Parallel–Port 16–Bit SoundPort Stereo Codec AD 1848, Rev. A.
Crystal Semiconductor Corporation Parallel Interface, Multimedia Audio Codec CS–4231 Mar. 1993.

Primary Examiner—Timothy P. Callahan
Assistant Examiner—My-Trang Nu Ton
Attorney, Agent, or Firm—Fulbright & Jaworski

[57] ABSTRACT

A hazard-free digital pulse divider circuit is provided which enables an output having a period one and one-half times that of the input pulse signal. Means for selectively extending output pulse in full or half period increments are also provided.

8 Claims, 9 Drawing Sheets

HAZARD-FREE DIVIDER CIRCUIT

CROSS REFERENCE TO RELATED APPLICATIONS

The instant application is related to the following patent applications filed on even date herewith, all of which are assigned to the common assignee of the present invention, and all of which are hereby incorporated by referenced thereto and made a part hereof as if fully set forth herein:

Monolithic PC Audio Circuit, application Ser. No. 08/333,451; Modular Integrated Circuit Power Control, application Ser. No. 08/333,537; Audio Processing Chip with External Serial Port, application Ser. No. 08/333,387; Wavetable Audio Synthesizer with Delay-Based Effects Processing, application Ser. No. 08/334,462; Wavetable Audio Synthesizer with Low Frequency Oscillators for Tremolo and Vibrato Effects, application Ser. No. 08/333,564; Wavetable Audio Synthesizer with Multiple Volume Components and Two Modes of Stereo Positioning, application Ser. No. 08/333,389; Wavetable Audio Synthesizer with an Interpolation Technique for Improving Audio Quality, application Ser. No. 08/333,398; Monolithic PC Audio Circuit with Enhanced Digital Wavetable Audio Synthesizer, 08/333,536; Wavetable Audio Synthesizer with Waveform Volume Control for Eliminating Zipper Noise, application Ser. No. 08/333,562; Digital Signal Processor Architecture for Wavetable audio Synthesizer, application Ser. No. 08/334,461; Wavetable Audio Synthesizer with Enhanced Register Array, application Ser. No. 08/334,463; A Digital Decimation and Compensation Filter System, application Ser. No. 08/333,403; Digital Interpolation Circuit for Digital to Analog Converter Circuit, application Ser. No. 08/333,399; Analog to Digital Converter Circuit, application Ser. No. 08/333,535; Stereo Audio Codec, application Ser. No. 08/333,467; Digital Noise Shaper, application Ser. No. 08/333,386; and Digital to Analog Converter, application Ser. No. 08/333,460.

BACKGROUND OF THE INVENTION

1. Field of the Invention

The present invention relates generally to digital signal divider circuits useful for providing an output digital signal having a frequency less than an input digital pulse or clock signal. More specifically, the present invention relates to variable, non-integer frequency division and hazard-free divider circuitry. The present invention is particularly useful in digital audio signal processing systems.

2. Brief Description of the Related Technology

In the prior art, frequency division in non-integer steps has been accomplished by utilizing combinatorial logic circuits to provide a propagation delay path for an input clock or digital pulse signal. The accuracy of such circuits was dependent upon the actual time delays realized in particular logic circuit elements. Actual delays, as distinguished from design specification, vary from one circuit to the next based upon process, the cell design, or environmental variables introduced in the manufacturing process or in use. Such prior art designs were therefore not hazard-free, and not reliable in applications requiring precision frequency division independent of process or environmental variables.

SUMMARY OF THE INVENTION

In contrast to the prior art, the present invention provides a digital signal divider circuit which is independent of process or environmental hazards. The circuits of the present invention provide the ability to generate an output signal having a period which is one and a half times that of the input clock or digital pulse signal, which is hazard-free. Additional embodiments of the present invention provide the ability to stretch or delay particular portions of the output signal as desired to provide enhanced signal processing capabilities particularly useful in digital audio signal processing applications.

The basic embodiment utilizes combinatorial logic to generate an output periodic pulse signal having a period which is 1.5 times the input clock. The output signal provided does not have a fifty percent duty cycle, and is comprised of stretched logic high or logic low states to provide the increased signal period.

BRIEF DESCRIPTION OF THE DRAWINGS

The above and other objects, features and embodiments of the present invention will be apparent to one familiar with the art from the following description of the preferred embodiment with reference to the accompanying drawings, in which.

DESCRIPTION OF THE PREFERRED EMBODIMENT

Figure 1:
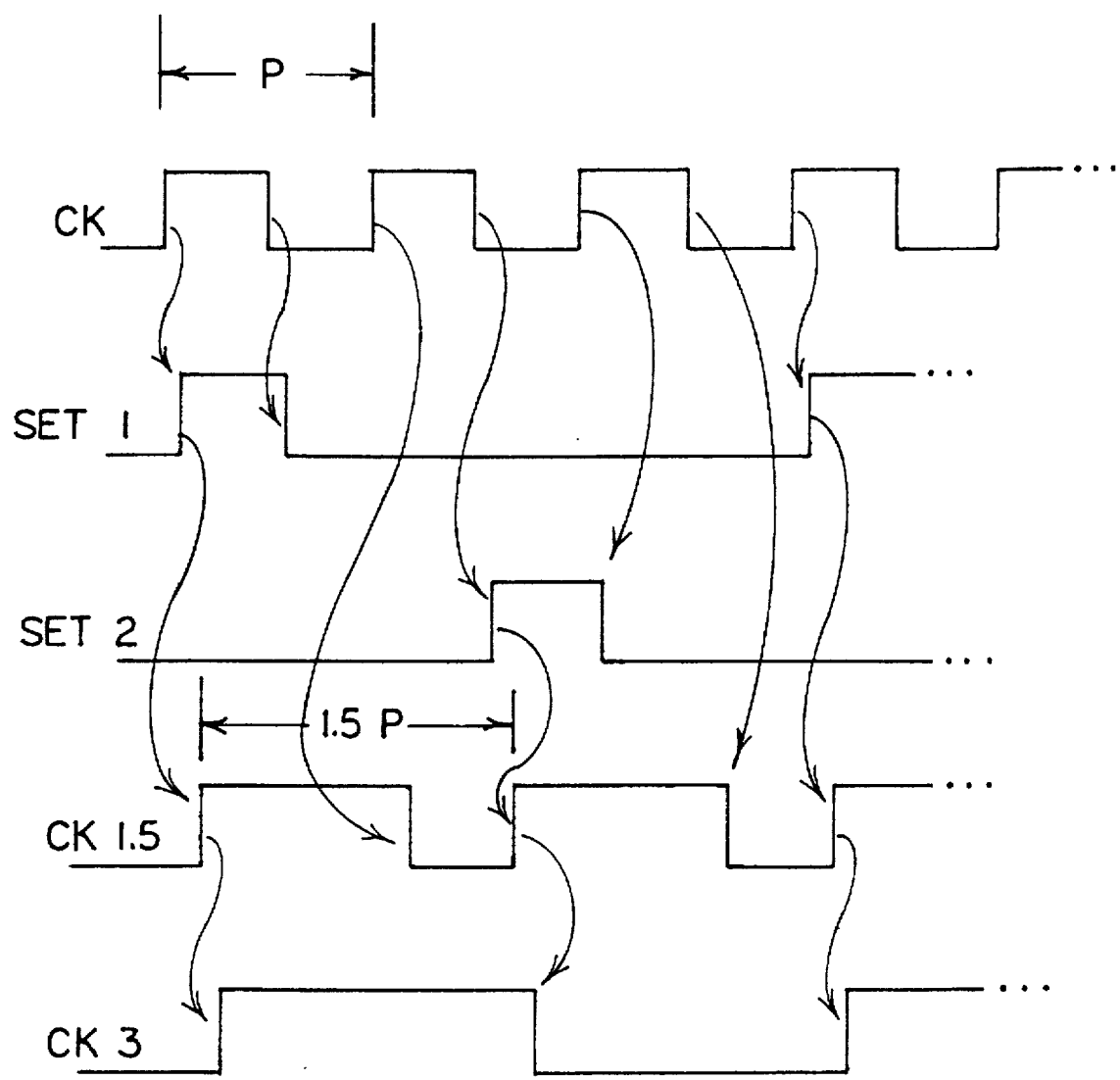
FIG. 1 is a signal timing diagram showing the relationship of the input clock signal, output clock signal and various internally generated timing signals.

Referring now to FIG. 1, the illustrated wave forms include an input digital pulse signal CK and the desired output digital pulse signal CK 1.5, where the signal CK has a period P and the desired output signal CK 1.5 has a period 1.5 times P. In the circuit of the present invention, signal CK is an input pulse or clock signal and signal CK 1.5 is the desired output signal. Signal CK 3 is internally generated from CK 1.5, and the SET 1, SET 2 are generated by internal logic, all as described below.

In general, in accordance with the logic equations set forth below, the arrows in FIG. 1 illustrate the timed relationship between the pulse forms. For example, the rising edge of signal CK triggers the rising edge of signal SET 1, followed by CK 1.5 and CK 3 in sequence. The falling edge of CK triggers the falling edge of SET 1. The second rising edge of CK triggers the first falling edge of CK 1.5. The second falling edge of CK triggers the first rising edge of SET 2 followed by the second rising edge of CK 1.5 and the first falling edge of CK 3. The third rising edge of CK triggers the falling edge of SET 2. The third falling edge of CK triggers the second falling edge of CK 1.5, thereby establishing the desired three to two pulse relationship between CK and CK 1.5. The cycle repeats itself starting with the fourth rising edge of CK triggering the second rising edge of SET 1, etc.

Figure 2:
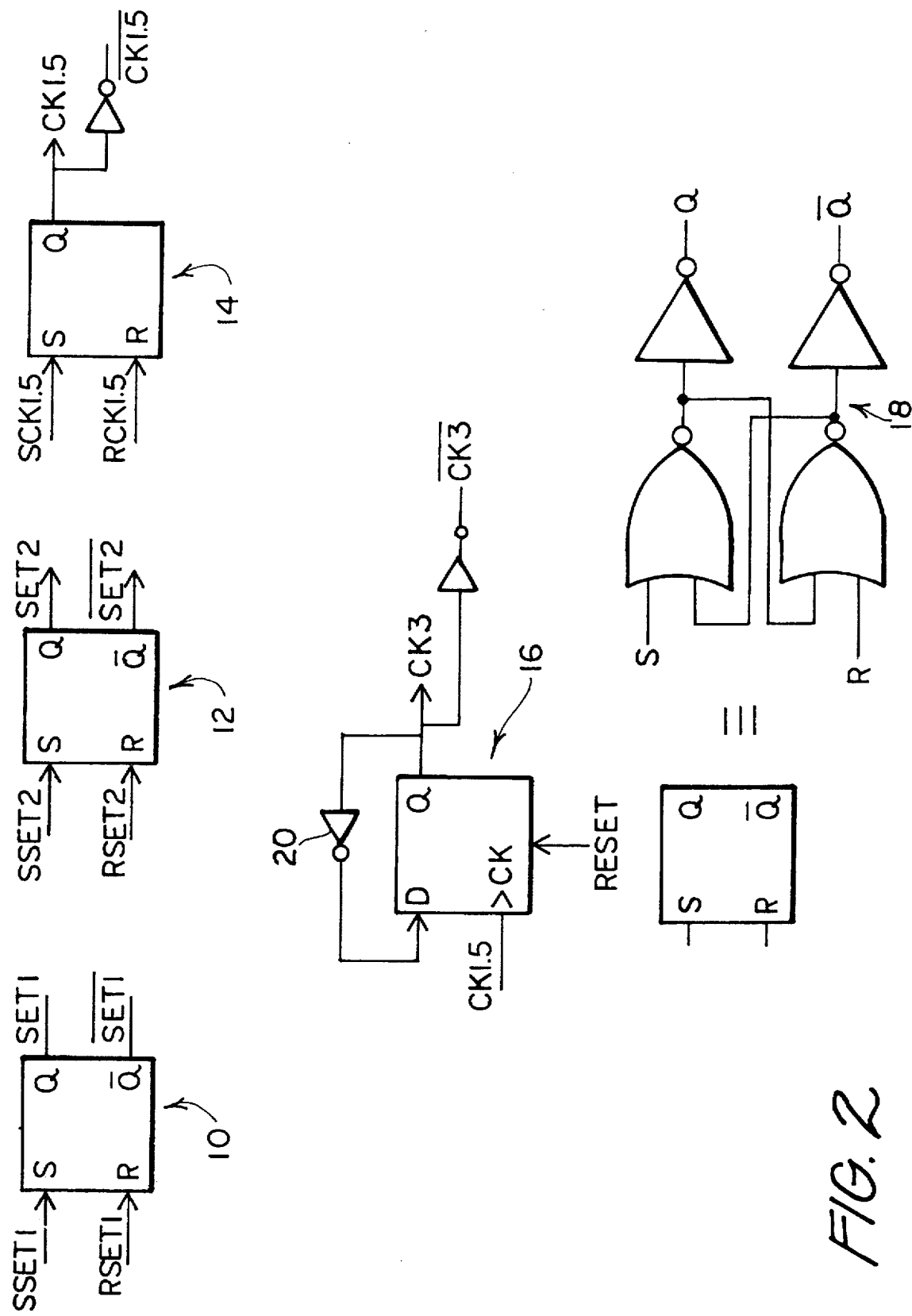
FIG. 2 is a top-level block diagram of the basic logic components utilized to provide the waveforms shown in FIG. 1.

Referring now to FIG. 2, the basic logic circuit components of one embodiment of the present invention, the circuit is implemented with a series of three R-S flip-flops 10, 12 and 14, and a D flip-flop 16. In this embodiment, each of the R-S flip-flops 10, 12 and 14 comprise cross-coupled NORGATE circuits 18. The signal CK 3 is derived as the Q output of D flip-flop 16 which is clocked by signal CK 1.5, and where the Q output is fed back through an inverter 20 to the D input of flip-flop 16.

The timed relationship of signals CK and CK 1.5 are established by additional logic defining the input signals to flip-flops 10, 12 and 14 which comprise SSET1, RSET1, SSET2, RSET2, SCK1.5 and RCK1.5. The logic circuits required may be implemented with any suitable logic satisfying the following equations:

SSET1 CK.fheightCK1.5.fheightCK3

RSET1 fheightCK

SSET2 fheightCK.fheightCK1.5.CK3

RSET2 CK

SCK1.5=SET1-SET2

Figure 3:
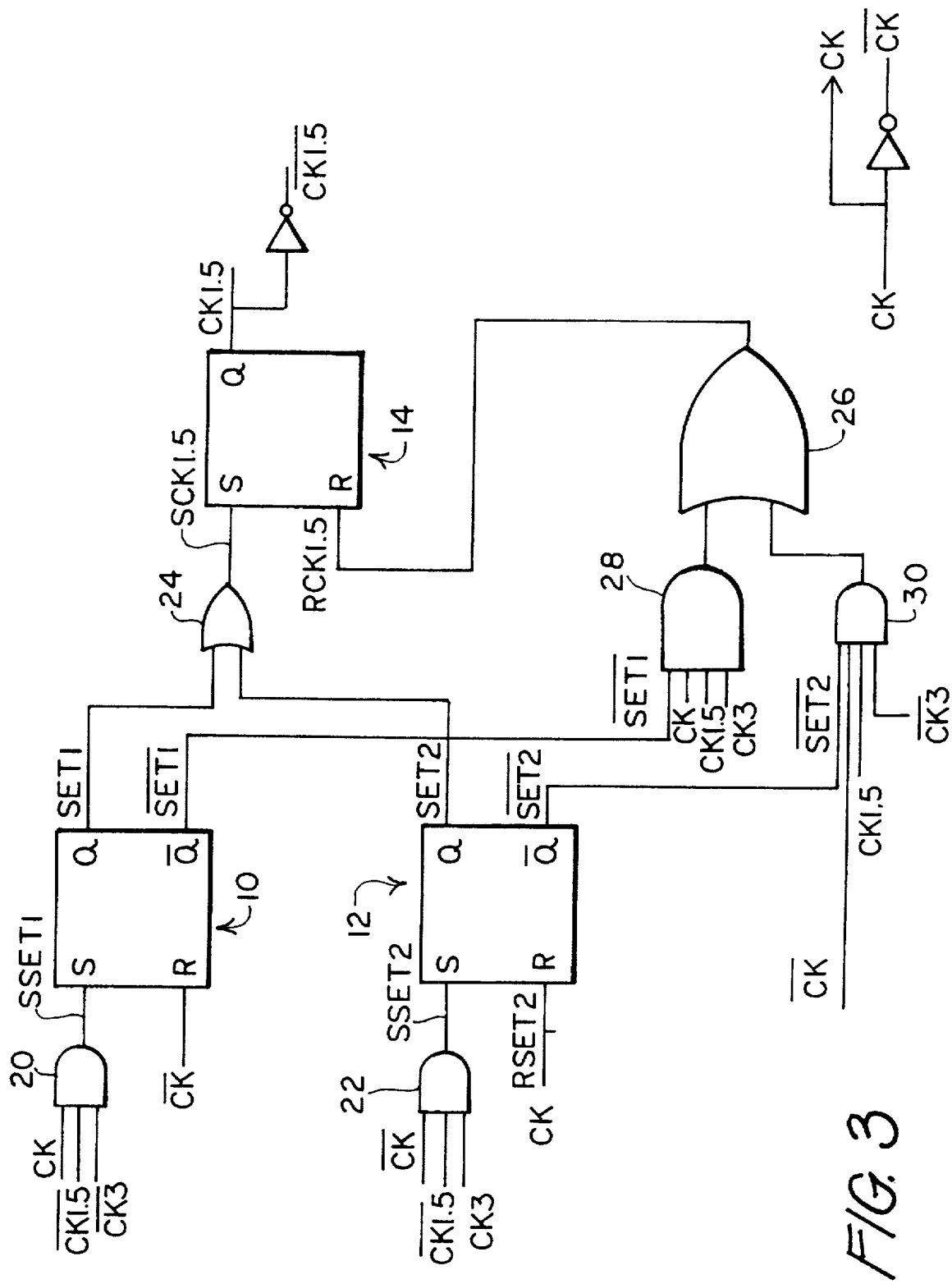
FIG. 3 is a gate-level diagram of logic circuits utilized to provide the wave forms shown in FIG. 1.

RCK1.5=fheightSET1.CK.CK1.5.CK3+fheightSET2.fheightCK.CK1.5.fheightCK3 (FIG. 3)

Alternatively, the last argument is functionally equivalent to and may be implemented (FIG. 4) as follows:

RCK1.5 fheightSET1.fheightSET2.CK1.5.(CK.CK3.fheightCK.fheightCK3)

In these equations, a superscript bar represents the logic NOT function, a "." represents the logic AND function and a "+" represents the logic OR function, and each are performed in that order of priority.

When implemented with NORGATE flip-flops 18 (FIG. 2), the logic circuits required are illustrated in FIG. 3. In this embodiment, flip-flop 10 receives a set input via three-input ANDGATE 10 which is enabled by logic high CK,fheightCK1.5 and fheightCK3. The reset input to flip-flop 20 is the inverted input clock, signal $\overline{CK}$.

Flip-flop 12 receives a set input via ANDGATE 22 which is enabled by logic high fheightCK ,fheightCK1.5 and CK3 and reset by the input clock signal CK. Flip-flop 14 is set by the output of ORGATE 24 which is enabled by logic high state of either SET1 or SET2 from flip-flops 10 or 12, respectively. Flip-flop 14 is reset by the output of ORGATE 26 which is enabled by a logic high output from either ANDGATE 28 or ANDGATE 30. ANDGATE 28 is enabled by simultaneous logic high states of signals fheightSET1, CK, CK1.5 and CK3. ANDGATE 30 is enabled by simultaneous logic high states of signals fheightSET2, fheightCK, CK1.5 and fheightCK3.

For NORGATE implementation of the embodiment of FIG. 3, ANDGATES 20, 22, 28 and 30 can be replaced with NORGATES and each of the inputs to these gates inverted in accordance with Demorgan's theorem. Likewise, ORGATE 24 can be replaced with a NORGATE then inverting the output.

Figure 4:
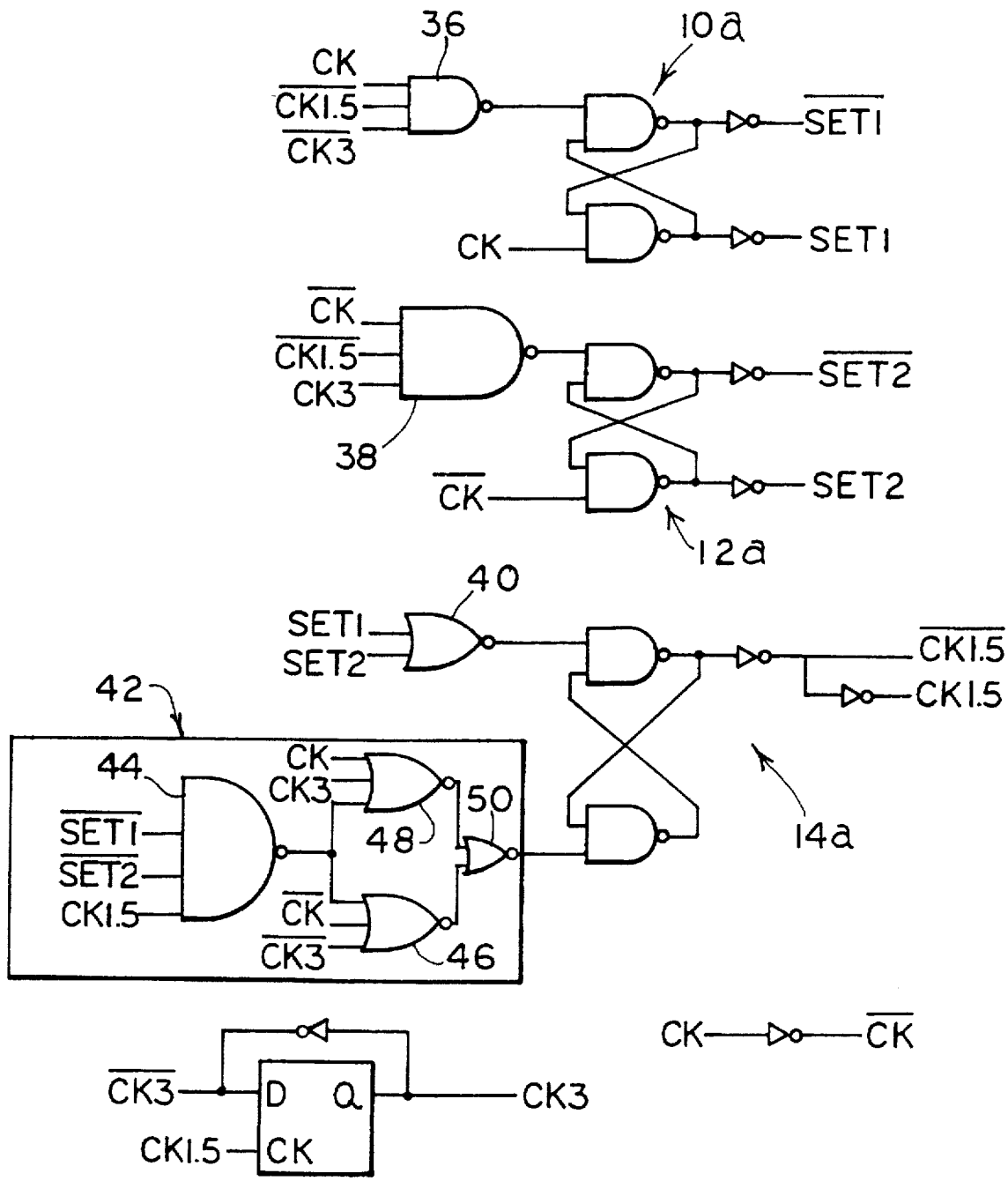
FIG. 4 is a gate level diagram of a NANDGATE embodiment of the present invention.

FIG. 4 illustrates an alternative NANDGATE embodiment of the present invention. NANDGATE implementation is preferred in some applications based upon manufacturing process considerations. In FIG. 4, flip-flops 10a, 12a and 14a perform like functions to their counterparts in the embodiment illustrated in FIG. 3. Again, the CK signal represents the input digital pulse signal, CK 1.5 is the desired output signal, and CK3 is derived in the same fashion as the prior embodiment. It should be noted that the CK1.5 signal is derived by inverting fheightCK1.5 rather than taking the inverted output of flip-flops 14 or 14a in both embodiments.

In the NANDGATE embodiment of FIG. 4, flip-flops 10a and 12a receive set inputs via NANDGATES 36 and 38, respectively, and are reset by the CK, fheightCK signals as shown. The outputs SET1, SET2 satisfy the logic 10 equations set forth above with regard to the prior embodiment. Signal CK1.5, is set by NORGATE 40 and reset by combinatorial logic 42. Logic circuit 42 includes a NANDGATE 44, and NORGATES 46, 48 and 50. Logic block 42 assures that the CK and fheightCK signals reach the R input of the flip-flops 10 and 12 before all other signals, as intended.

In these embodiments, the basic principle of operation is that the SET1 and SET2 signals are alternatively used to extend the high phase of CK1.5 signal to create the desired frequency division from the CK signal. Alternatively, the circuit could readily be modified to extend the low phase of CK1.5 by using the inverted CK1.5 signal fheightCK1.5.

Figure 5:
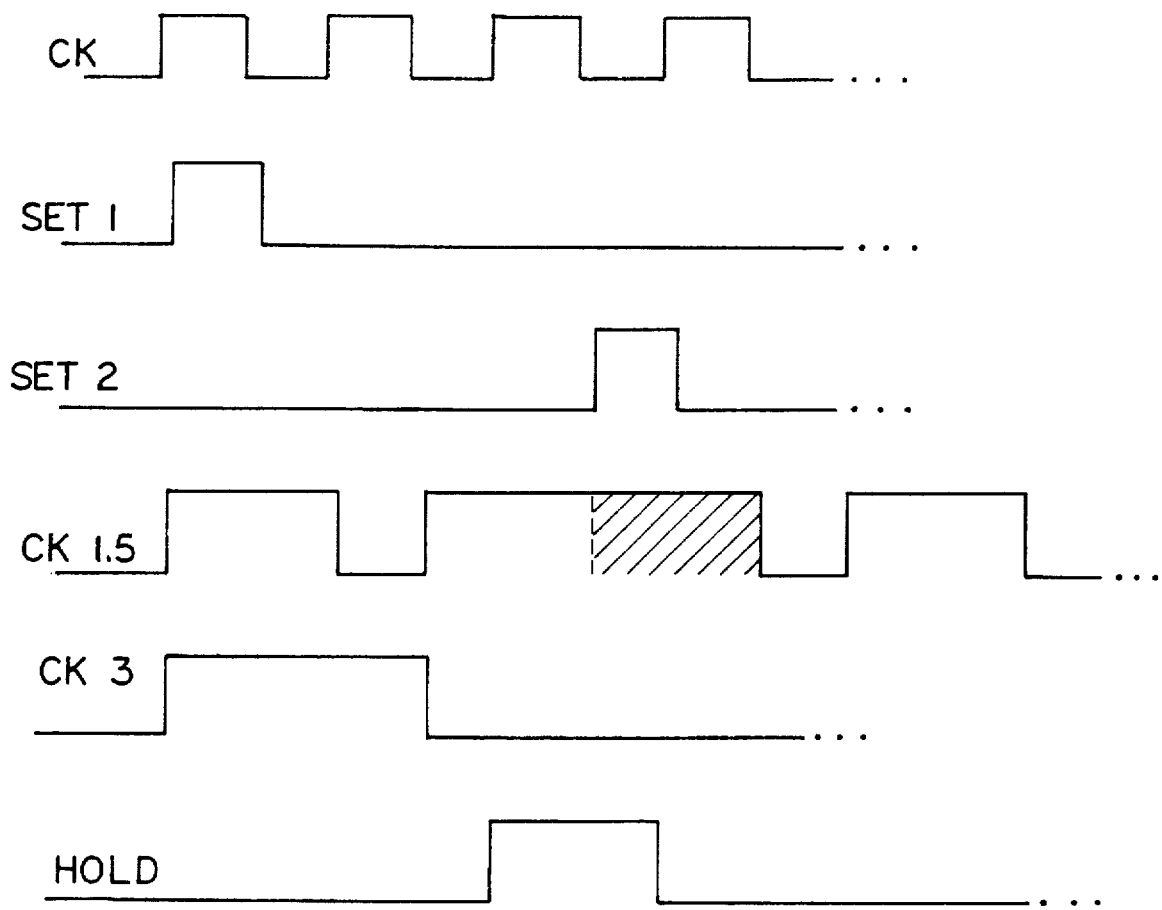
FIG. 5 is a timing diagram illustrating the input/output signal relationships in an alternative embodiment wherein one phase of the output signal is stretched in one-clock increments.
Figure 6:
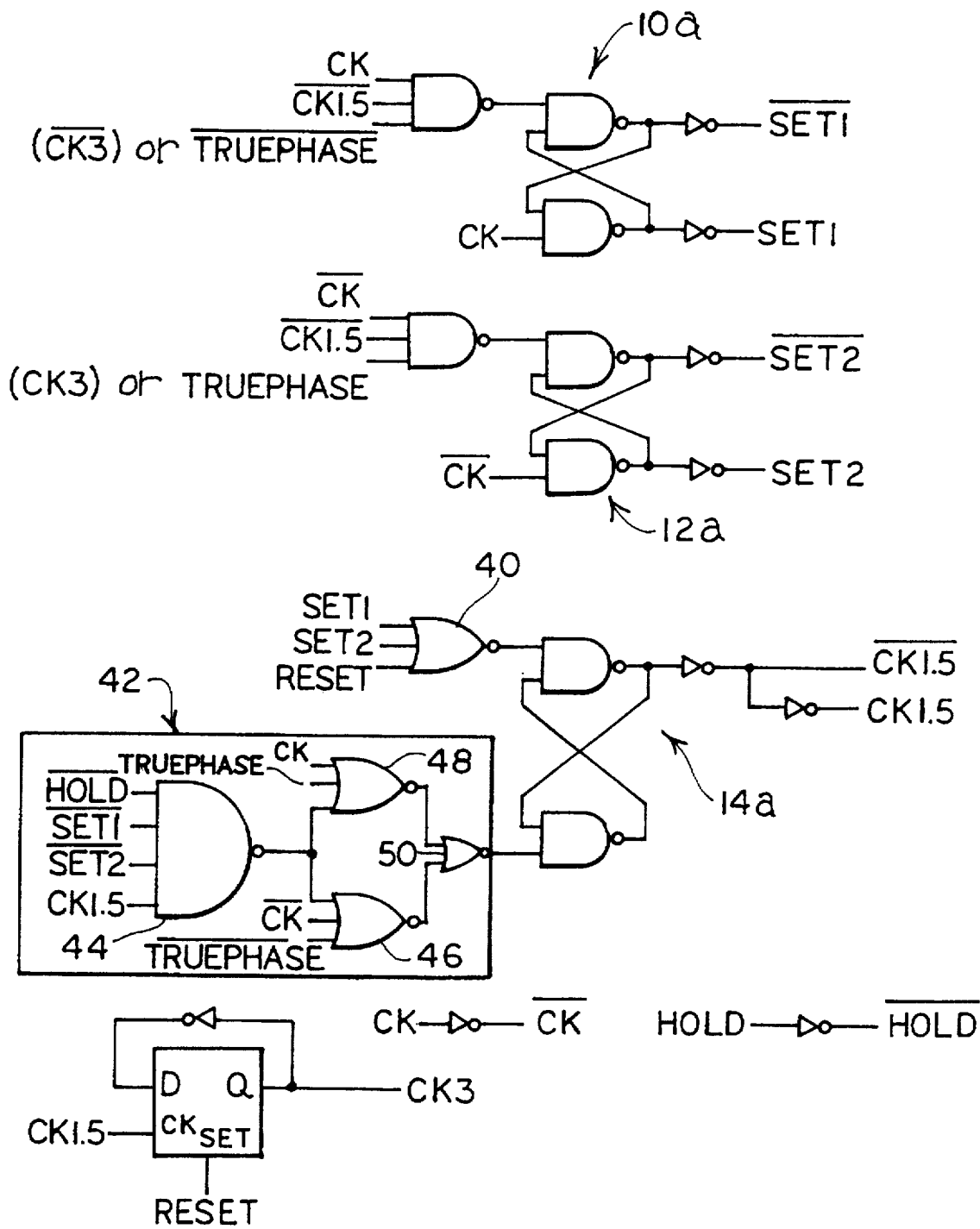
FIG. 6 is a gate-level diagram of logic circuits utilized to provide the wave forms shown in FIG. 5.

An alternative embodiment, wherein an additional, internally generated HOLD signal is used to stretch or hold CK1.5 high in one-clock increments is illustrated in FIGS. 5 and 6. In FIG. 5, the signal HOLD, when active high, causes the high phase of CK1.5 to be extended for a single period of input clock signal CK. This extension is illustrated by the cross-hatched portion of the second high phase of CK1.5 in FIG. 5.

Figure 8:
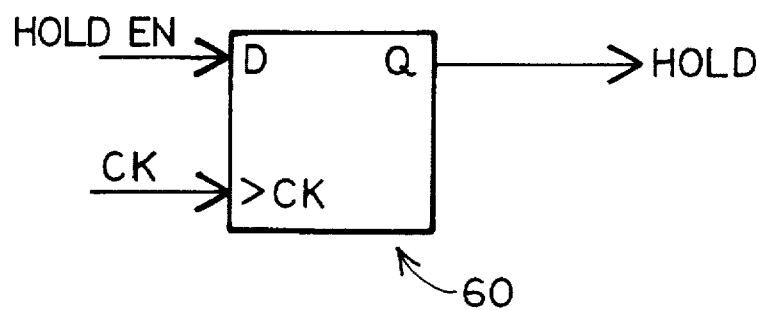
FIG. 8 is a schematic illustration of the circuits for generating HOLD and PHASE input signals.
Figure 8:
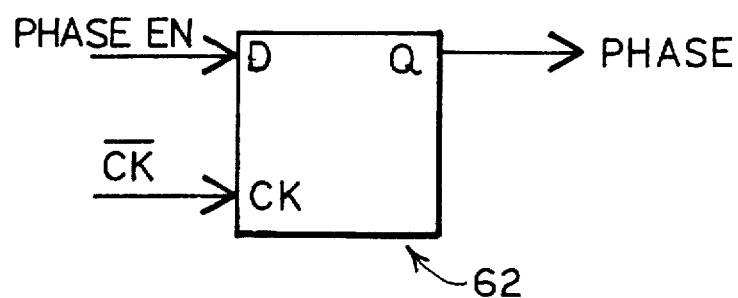
Figure 8:
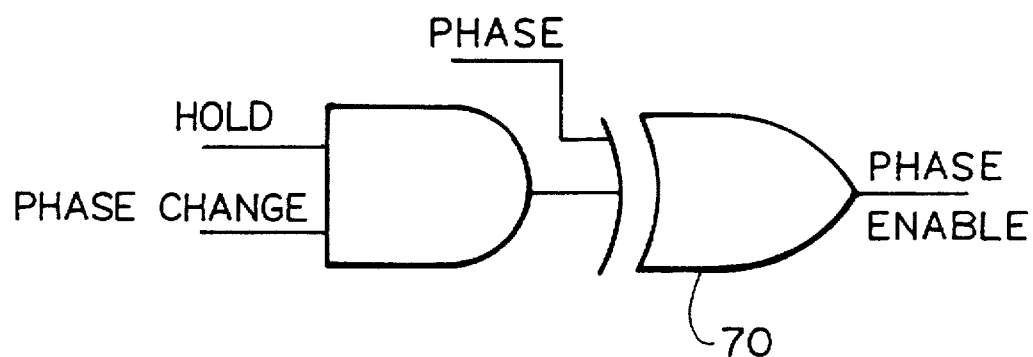

In this embodiment, the HOLD signal can be generated in any suitable fashion to provide a timed positive pulse form. Where the clock-divider is used in a larger circuit having programmable registers to control clock functions, the HOLD input to the present invention can be provided as the Q output of a D-flip-flop 60 which is clocked by signal CK, and has a D input, a HOLD Enable signal which is responsive to the status of a specified register. Such an arrangement is schematically illustrated in FIG. 8. In this embodiment, assertion of HOLD extends CK1.5 in one-clock increments. CK1.5 will transition to a logic low on the next phase of input clock CK after HOLD is disabled.

The logic design for this embodiment is the same as the basic embodiment, except for the following change:

RCK1.5 SET1.CK.CK1.5.CK3+HOLD.SET2.CK.CK1.5CK3

Alternatively, the last argument is functionally equivalent to and may be implemented as follows:

RCK1.5=HOLD.SET1.SET2.CK1.5.(CK.CK3+$\overline{CK}$.$\overline{CKE}$)

Figure 6A:
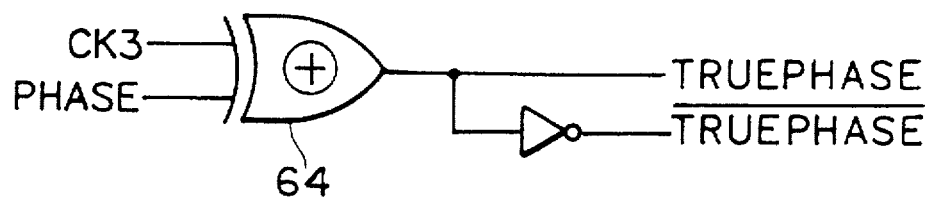
FIG. 6a is a schematic illustration of a logic circuit utilized to generate signals in the present invention.

Gate level logic circuitry for this embodiment is provided in FIG. 6. FIG. 6 includes PHASE and TRUEPHASE signals which are used in yet another embodiment. To implement only the present variation, wherein the CK1.5 signal is stretched in one-clock increments, the signal CK3 is substituted for TRUEPHASE in all places. This relationship is logically illustrated in FIG. 6a where TRUEPHASE is the output of EXCLUSIVE ORGATE 64 which receives inputs CK3 and PHASE. Where PHASE is not provided, TRUEPHASE=CK3.

Further to FIG. 6, the HOLD input is provided as an additional input to NANDGATE 44. In block 42, in the one clock extension embodiment, where the PHASE signal is not utilized, the TRUEPHASE and $\overline{\text{TRUEPHASE}}$ inputs to NORGATES 46 and 48 will equal CK3 and fheightCK3, respectively. Yet another embodiment of the present invention provides the ability to extend or stretch one phase (either high or low) of output clock CK1.5 in one-half clock increments, or one-half the period of clock CK. A timing diagram for this embodiment is provided in FIG. 7. In either the one clock period or one-half clock period embodiments only the longer of the two phases of the clock signal may be extended. In the embodiments illustrated, the high phase of the CK1.5 signal is extended. If it is desired to produce an output signal CK1.5 with an extended low phase, an inverter can be added at the output.

Figure 7:
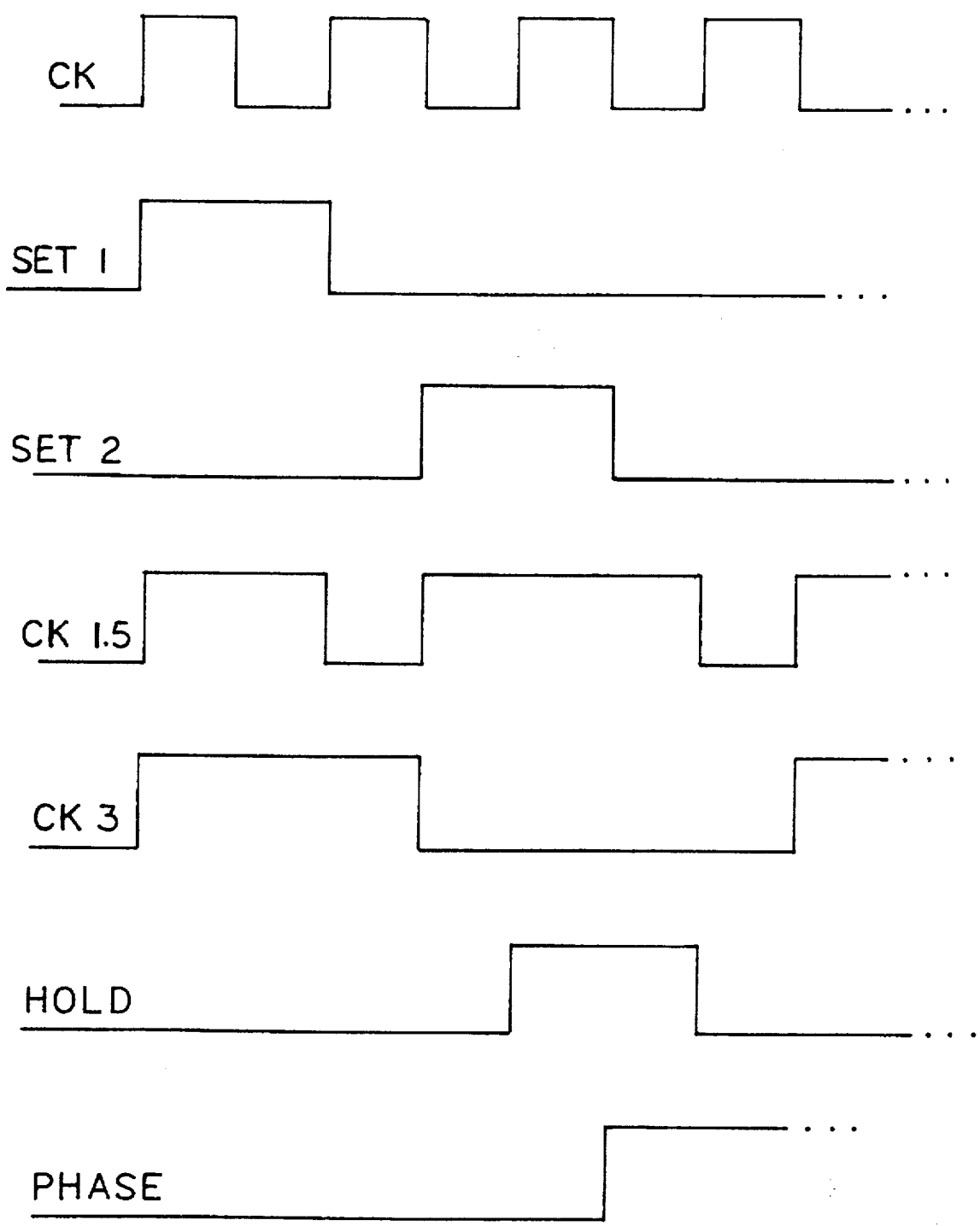
FIG. 7 is a timing diagram illustrating the input/output signal relationships in an alternative embodiment wherein one phase of the output signal is stretched in one-half clock increments.

In the one-half clock embodiment of FIGS. 6 and 7, input signals are CK, HOLD and PHASE. The output signal is CK1.5. The input HOLD is generated as described above. The PHASE input is also a register controlled input in the preferred embodiment, generated as illustrated in FIG. 8, as the output of D-flip-flop 62. To enable one-half clock period extensions of CK1.5, HOLD when enabled goes to a logic high state on a rising edge of CK and only when CK1.5 is already in a logic high phase. HOLD, when disabled, transitions low on the next falling edge of CK.

PHASE transitions to a logic high on the negative edge of CK after HOLD is at a logic high state (see FIG. 8). Asserting HOLD immediately followed by PHASE on the low transition or falling edge of CK causes CK1.5 to be extended by one-half the period of CK. It is desirable to be able to extend the selected phase by half-increments on a successive or intermittent basis. In the PHASE ENABLE circuit of FIG. 8, the output of EXCLUSIVE ORGATE 70, PHASE ENABLE will be high when PHASE changes state while HOLD is high. This allows toggling the state of PHASE to intermittently or consecutively extend the phase of CK1.5 by one-half clock period increments.

The design equations for this one-half period extender are the same as for the base divider with the following change:

$$RCK1.5=\overline{HOLD.SET1.SET2.CK1.5(CK.CK3+CKCK3)}$$

Also, in the base equations all CK3 terms are replaced by (CK3 XOR PHASE). Making these substitutions provides:

$$SSET1=CK.\overline{fheightCK1.5.(fheightCK3 \text{ XOR PHASE})}$$

$$RSET1=\overline{fheightCK}$$

$$SSET2=\overline{fheightCK.fheightCK1.5.(fheightCK3 \text{ XOR PHASE})}$$

$$RSET2=\overline{fheightCK}$$

$$SCK1.5=SET+SET2$$

Figure 9:
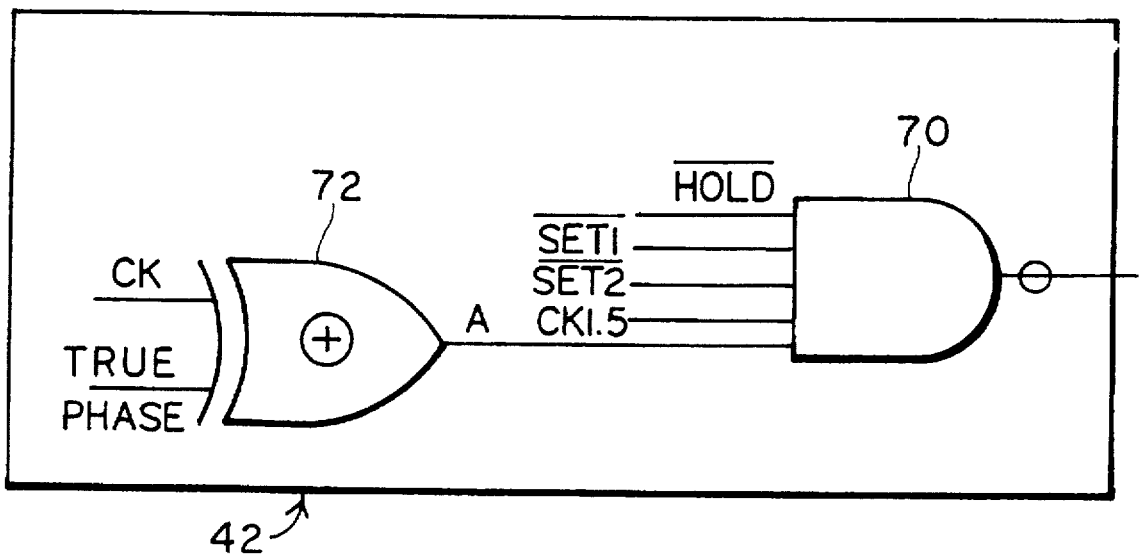
FIG. 9 is a schematic illustration of an alternative embodiment of a portion of the circuit of the present invention.

In all circuits, where appropriate, a reset or start clock signal can be provided to set the logic to a known state. Typically, this signal will be utilized to set CK1.5, CK3 high. An alternative embodiment of logic block 42 (FIG. 6) is illustrated in FIG. 9. In this embodiment, NANDGATE 70 provides the reset output to flip-flop 14a, and is enabled by simultaneous logic low states on the signals indicated. In this embodiment, care should be taken to assure that the delay between the rising edge of CK and asserting HOLD be greater than the delay between the rising edge of CK and output A on XORGATE 72 of FIG. 9.

The present invention, therefore, is well adapted to carry out the objects and attain the ends and advantages mentioned herein as well as other ends and advantages made apparent from the disclosure. While preferred embodiments of the invention have been described for the purpose of disclosure, numerous changes and modifications to those embodiments described herein will be readily apparent to those skilled in the art and are encompassed within the spirit of the invention and the scope of the following claims.

What is claimed is:

1. A digital pulse signal divider circuit for providing an output digital pulse signal having a period one and one-half times that of an input digital pulse signal, said divider circuit comprising:

a first delay pulse generator, said first pulse generator providing a first output pulse asserted on a first edge of an input distal pulse signal and unasserted on the next edge following said first edge of the input pulse signal;

a second delay pulse generator, said second pulse generator providing a second output pulse asserted on the third edge following said first edge of the input pulse signal and unasserted on the fourth edge following said first edge of the input pulse signal; and an output pulse generator for generating an output digital pulse signal, said output pulse generator receiving said first and said second output pulses as inputs, wherein said output pulse generator maintains a selected phase output when either said first or said second output pulses are at the selected phase.

2. The divider circuit of claim 1, wherein said first and second delay pulse generators comprise RS flip-flops.

3. The divider circuit of claim 2, wherein said output pulse generator comprises an RS flip-flop.

4. The divider circuit of claim 3, further comprising an internal clock generator for generating an internal digital pulse having a period three times that of the input pulse signal; wherein:

said first delay generator receives SSET and RSET1 as inputs and provides SET1 and fheightSET1 as outputs;

said second delay generator receives SSET2 and RSET2 as inputs and provides SET2 and fheightSET2 as outputs;

said output pulse generator receives SCK1.5 and RCK1.5 as inputs and provides an output digital pulse signal having a period 1.5 times that of said input digital pulse signal; and wherein said inputs to said flip-flops are defined by combinatorial logic in accordance with the following relationships:

$$SSET1=CK.\overline{fheightCK1.5.fheightCK3}$$

$$RSET1=\overline{CK}$$

$$SSET2=\overline{CK.fheightCK1.5.fheightCK3}$$

$$RSET2=\overline{CK}$$

$$SCK1.5=SET1-SET2$$

$$RCK1.5 = \overline{fheight SET1} \cdot CK \cdot CK1.5 \cdot CK3 + \overline{fheight SET2} \cdot \overline{fheight CK} \cdot CK1.5 \cdot CK3;$$

wherein CK equals the input digital pulse; CK1.5 equals the desired output; CK3 equals the internally generated triple-period pulse.

5. The circuit of claim 4, wherein the combinatorial logic for input RCK1.5 is defined as follows:

$$RCK1.5 \quad \overline{fheight SET1} \cdot \overline{fheight SET2} \cdot CK1.5 \cdot (CK \cdot CK3 + \overline{fheight CK} \cdot \overline{fheight CK3}).$$

6. The circuit of claim 1, further comprising:
means for selectively extending the period of selected pulses of the desired output pulse signal.

7. The circuit of claim 6, wherein said means for extending the period of selected output pulses comprises means for extending the period in increments equal to the period of the input digital pulse signal.

8. The circuit of claim 6, wherein said means for extending the period of selected output pulses comprises means for extending the period in increments equal to one-half the period of the input digital pulse signal.

* * * * *

UNITED STATES PATENT AND TRADEMARK OFFICE
CERTIFICATE OF CORRECTION

PATENT NO. : 5,528,181  
DATED : June 18, 1996  
INVENTOR(S) : Suggs

It is certified that error appears in the above-indentified patent and that said Letters Patent is hereby corrected as shown below:

At col. 3, delete lines 28 - 38 and insert therefore:

$$SSET1 = CK \cdot \overline{CK1.5} \cdot \overline{CK3}$$
$$RSET1 = \overline{CK}$$
$$SSET2 = \overline{CK} \cdot \overline{CK1.5} \cdot CK3$$
$$RSET2 = CK$$
$$SCK1.5 = SET1 + SET2$$
$$RCK1.5 = \overline{SET1} \cdot CK \cdot CK1.5 \cdot CK3 + \overline{SET2} \cdot \overline{CK} \cdot CK1.5 \cdot \overline{CK3} \text{ (Fig. 3)}$$

At col. 3, delete line 41 and insert therefore:

$$RCK1.5 = \overline{SET1} \cdot \overline{SET2} \cdot CK1.5 \cdot (CK \cdot CK3 \cdot \overline{CK} \cdot \overline{CK3})$$

At col. 3, line 51, delete "fheightCK1.5" and insert therefore -- $\overline{CK1.5}$ --.

At col. 3, line 52, delete "fheight".

At col. 3, line 52, delete "20" and insert therefore -- 10 --.

At col. 3, line 55, delete "fheight" (two occurrences).

At col. 3, line 62, delete "fheight".

At col. 3, line 64, delete "fheight (two occurrences).

At col. 3, line 65, delete "fheight".

UNITED STATES PATENT AND TRADEMARK OFFICE
CERTIFICATE OF CORRECTION

PATENT NO. : 5,528,181
DATED : June 18, 1996
INVENTOR(S) : Suggs

It is certified that error appears in the above-indentified patent and that said Letters Patent is hereby corrected as shown below:

At col. 4, line 14, delete "fheight".

At col. 4, line 32, delete "fheight".

At col. 4, delete line 55 and insert therefore:

-- $RCK1.5 = \overline{SET1} \cdot CK \cdot CK1.5 \cdot CK3 + \overline{HOLD} \cdot \overline{SET2} \cdot \overline{CK} \cdot CK1.5 \cdot \overline{CK3}$ --.

At col. 4, delete line 60 and insert therefore:

-- $RCK1.5 = \overline{HOLD} \cdot \overline{SET1} \cdot \overline{SET2} \cdot CK1.5 \cdot (CK \cdot CK3 + \overline{CK} \cdot \overline{CKE})$ --.

At col. 5, line 8, delete "1"
At col. 5, line 9, delete "fheight".

At col. 5, delete line 51 and insert therefore:

-- $RCK1.5 = \overline{HOLD} \cdot \overline{SET1} \cdot \overline{SET2} \cdot CK1.5 \, (CK \cdot CK3 + \overline{CK} \cdot \overline{CK3})$ --.

At col. 5, delete lines 55 - 63 and insert therefore:

--
$$SSET1 = CK \cdot \overline{CK1.5} \cdot \overline{(CK3 \text{ XOR PHASE})}$$
$$RSET1 = \overline{CK}$$
$$SSET2 = \overline{CK} \cdot \overline{CK1.5} \cdot \overline{(CK3 \text{ XOR PHASE})}$$
$$RSET2 = \overline{CK}$$
$$SCK1.5 = SET + SET2$$
--.

UNITED STATES PATENT AND TRADEMARK OFFICE
CERTIFICATE OF CORRECTION

PATENT NO. : 5,528,181
DATED : June 18, 1996
INVENTOR(S) : Suggs

It is certified that error appears in the above-indentified patent and that said Letters Patent is hereby corrected as shown below:

At col. 6, line 49, delete "fheight".

At col. 6, line 51, delete "fheight".

At col. 6, delete lines 60 - 67 and insert therefore:

$$SSET1 = CK \cdot \overline{CK1.5} \cdot \overline{CK3}$$
$$RSET1 = CK$$
$$SSET2 = CK \cdot \overline{CK1.5} \cdot \overline{CK3}$$
$$RSET2 = CK$$
$$SCK1.5 = SET1 + SET2$$

UNITED STATES PATENT AND TRADEMARK OFFICE
CERTIFICATE OF CORRECTION

PATENT NO. : 5,528,181
DATED : June 18, 1996
INVENTOR(S) : Suggs

It is certified that error appears in the above-indentified patent and that said Letters Patent is hereby corrected as shown below:

At col. 7, delete line 1 and insert therefore:

— $RCK1.5 = \overline{SET1} \cdot CK \cdot CK1.5 \cdot CK3 + \overline{SET2} \cdot \overline{CK} \cdot CK1.5 \cdot CK3$ —.

At col. 7, delete line 9 and insert therefore:

— $RCK1.5 = \overline{SET1} \cdot \overline{SET2} \cdot CK1.5 \cdot (CK \cdot CK3 + \overline{CK} \cdot \overline{CK3})$ —.

Signed and Sealed this

Tenth Day of December, 1996

Attest:

BRUCE LEHMAN

Attesting Officer

Commissioner of Patents and Trademarks